United States Patent [19]
Ansel et al.

[11] Patent Number: 6,016,277
[45] Date of Patent: *Jan. 18, 2000

[54] REFERENCE VOLTAGE GENERATOR FOR READING A ROM CELL IN AN INTEGRATED RAM/ROM MEMORY DEVICE

[75] Inventors: George M. Ansel, Starkville; Jeffery S. Hunt, Ackerman; Satish Saripella, Starkville; Sudhaker Reddy Anumula, Starkville; Ajay Srikrishna, Starkville, all of Miss.

[73] Assignee: Cypress Semiconductor Corporation, San Jose, Calif.

[*] Notice: This patent is subject to a terminal disclaimer.

[21] Appl. No.: 08/884,581

[22] Filed: Jun. 27, 1997

[51] Int. Cl.$^7$ ........................................ G11C 7/06
[52] U.S. Cl. ................... 365/189.09; 365/104; 365/190; 365/210; 365/202; 365/203; 327/540; 327/541
[58] Field of Search ............................. 365/189.09, 104, 365/154, 156, 190, 210, 202, 203; 327/540, 541; 323/313

[56] References Cited

U.S. PATENT DOCUMENTS

| | | | |
|---|---|---|---|
| 4,354,255 | 10/1982 | Stewart | 365/154 |
| 4,402,065 | 8/1983 | Taylor | 365/189.02 |
| 4,482,984 | 11/1984 | Oritani | 365/154 |
| 4,575,819 | 3/1986 | Amin | 365/104 |
| 4,855,803 | 8/1989 | Azumai et al. | 257/202 |
| 4,975,879 | 12/1990 | Auvinen | 365/189.09 |
| 5,365,475 | 11/1994 | Matsumura et al. | 365/154 |
| 5,392,235 | 2/1995 | Nishitani et al. | 365/154 |
| 5,523,915 | 6/1996 | Kamuda | 365/189.01 |

Primary Examiner—Andrew Q. Tran
Attorney, Agent, or Firm—Blakely, Sokoloff Taylor & Zafman LLP

[57] ABSTRACT

A reference voltage generator may include an input for receiving a first voltage for input to a sense amp. The reference voltage generator may also include an output for outputting a second voltage for input to the sense amp. The second voltage is influenced by the first voltage. Alternatively, a reference voltage generator may include a first input for receiving a first voltage on a first bitline. The reference voltage generator may also include a first output for outputting a second voltage on a second bitline. The second voltage is influenced by the first voltage. Alternatively, a reference voltage generator may include a first input for receiving a first voltage on a first transmission busline. The voltage generator may also include a first output for outputting a second voltage on a second transmission busline. The second voltage is influenced by the first voltage.

18 Claims, 6 Drawing Sheets

REFERENCE VOLTAGE GENERATOR FOR READING A ROM CELL IN AN INTEGRATED RAM/ROM MEMORY DEVICE

RELATED APPLICATION

This application is related to Ser. Application No. 08/884,561, filed, Jun. 27, 1997, now U.S. Pat. No. 5,880,999 and entitled "Read Only/Random Access Memory Architecture and Methods for Operating Same", by George M. Ansel, Jeffery S. Hunt, Satish Saripella, Sudhaker R. Anumula and Ajay Srikrishna and assigned to the Assignee of the present invention.

FIELD OF THE INVENTION

The present invention is related to the generation of reference voltages for reading a read only memory (ROM) in a memory device and, more particularly, to the generation of such voltages in an integrated ROM/RAM memory device.

BACKGROUND

Many devices (e.g., pagers) have a need for read only memory (ROM) and read/write memory (commonly called random access memory or RAM). ROM is typically used to store fixed data and instructions for execution by a processor (CPU). RAM is used to store data and instructions that may be changed and updated repeatedly by the CPU. In most systems, ROM and RAM are used as separate, independent memory components, with each memory component having its own address, data, control and power lines. However, the increasing demand for miniaturized devices has required the adoption of efficient system design practices such as the sharing of circuitry by system components or, where possible, the integration of two components into one component.

ROM and RAM are typically implemented as separate memory components for a variety of reasons. For example, ROM and RAM cells generate voltages that represent the logic state of a cell in incompatible ways. Unlike RAM cells which are typically "double-ended" and generate two voltages representing the state of a cell, ROM cells are typically "single-ended" and only generate a single voltage representing the state of a cell (state voltage). Consequently, determining the state of a ROM cell typically requires the use of a reference voltage generator which provides a separate (reference) voltage to a sense amplifier. Such reference voltage generators are not required to determine the state of a RAM cell because the two voltages generated by the RAM cell may be applied to different inputs of a sense amplifier.

These and other differences between conventional RAM architectures and conventional ROM architectures have heretofore presented obstacles to the integration of RAM and ROM cells within a single memory device.

SUMMARY OF THE INVENTION

In one embodiment, the present invention provides a reference voltage generator that may include a first input for receiving a first voltage for input to a sense amplifier. The reference voltage generator may also include a first output for outputting a second voltage for input to the sense amplifier. The second voltage is influenced by the first voltage.

In an alternative embodiment, the present invention provides a reference voltage generator that may include a first input for receiving a first voltage on a first bitline. The reference voltage generator also may include a first output for outputting a second voltage on a second bitline. The second voltage is influenced by the first voltage.

In another embodiment, the present invention provides a reference voltage generator that may include a first input for receiving a first voltage on a first transmission busline and a first output for outputting a second voltage on a second transmission busline. The second voltage on the second transmission busline is influenced by the first voltage on the first transmission busline.

DESCRIPTION OF THE DRAWINGS

The present invention is illustrated by way of example, and not limitation, in the figures of the accompanying drawings in which.

DETAILED DESCRIPTION

A reference voltage generator for a memory device is described. The present invention provides methods and apparatus for sensing the logic states of a RAM cell and a ROM cell having common bitlines and a common sense amplifier. Although described with reference to certain specific embodiments, those skilled in the art will recognize that the present invention may be practiced without some or all of these details and, further, that the invention may be used in a RAM/ROM integrated architecture having shared bitlines, a ROM with dual bitlines, or in other single-ended sense applications. Additionally, in one embodiment, the present invention provides improved signal margins for a sense amplifier by integrating a reference voltage generator for sensing ROM cells in a memory core. Improved signal margins result from having a voltage on a first bitline modulate another voltage on second bitline.

As used herein, the term logic low voltage is used to refer to any voltage (e.g., a voltage on a bitline) that may represent a logic zero, and not necessarily a voltage equal to Vss. Similarly, the term logic high voltage is used to refer to any voltage that may represent a logic one, and not necessarily a voltage equal to Vcc.

Figure 1:
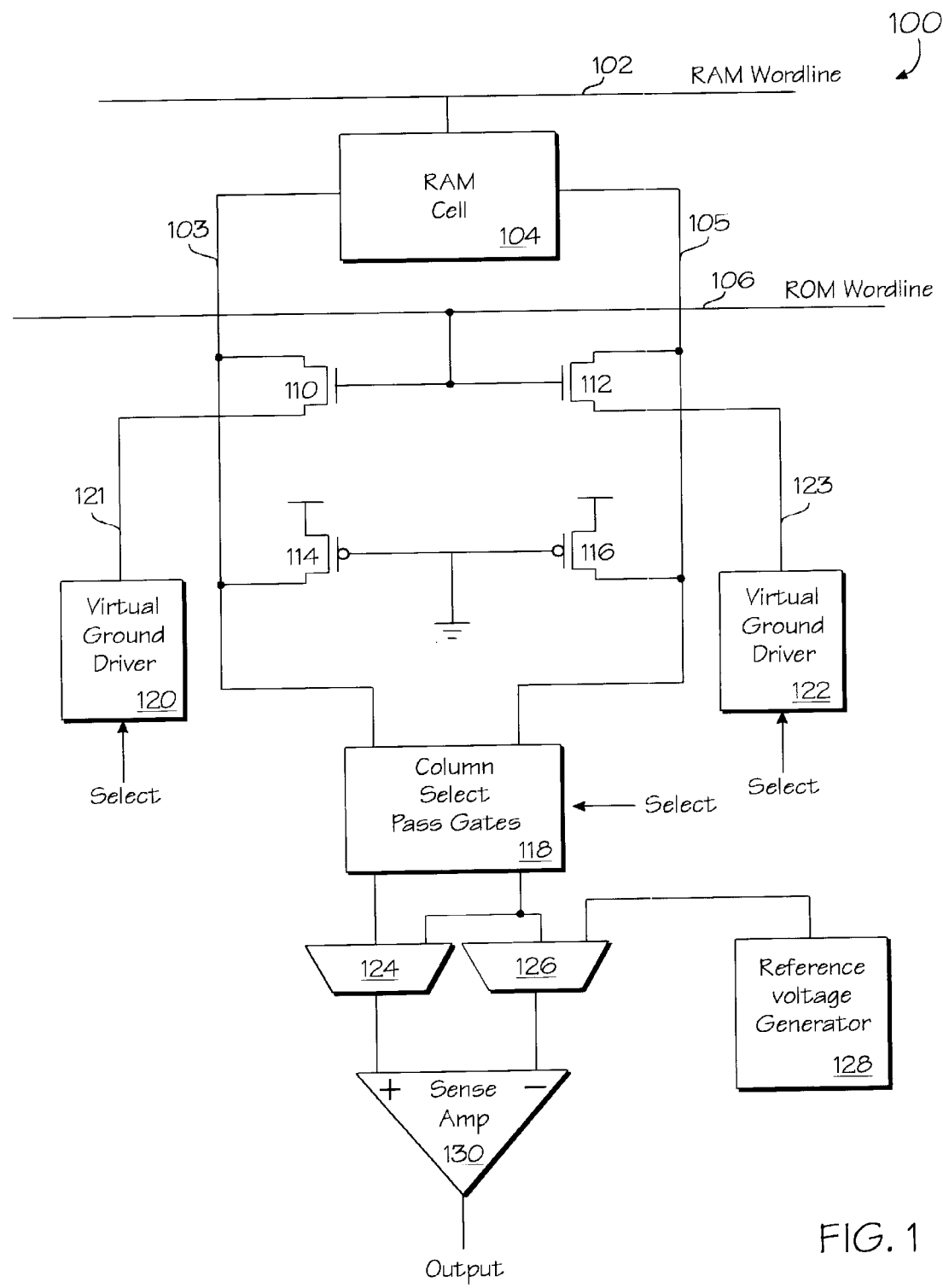
FIG. 1 illustrates one embodiment of a RAM/ROM architecture having shared bitlines and a shared sense amplifier.

FIG. 1 illustrates a memory 100 which generally includes a RAM cell 104 coupled between two bitlines 103 and 105. RAM cell 104 has an input configured to receive a voltage signal on a RAM wordline 102 that may select a whole row of RAM cells in memory 100. Memory 100 also includes a ROM cell 110 coupled to a ROM wordline 106 and to a conventional virtual ground driver 120 and to bitline 103. Another ROM cell 112 is also coupled to the ROM wordline 106 and to another conventional virtual ground driver 122 and to bitline 105. The logic states of RAM cell 104, ROM cell 110 and ROM cell 112 are determined by sensing the voltages on bitlines 103 and 105 with a sense amplifier 130. The manner in which this voltage sensing is accomplished for ROM cells 110 and 112 is further described below.

Also coupled to bitline 103 is a bitline load transistor 114 for keeping bitline 103 at substantially a source voltage. Likewise, coupled to bitline 105 is a bitline load transistor 116 for keeping bitline 105 at substantially the source voltage. Bitline load transistors 114 and 116 are coupled as resistors and other embodiments may utilize conventional resistors.

Column select pass gates 118 are used to couple bitlines 103 and 105 to sense amplifier 130 in response to (a) select signal(s) (e.g., from column decoding logic (not shown)). The outputs of column select pass gates 118 are provided to multiplexers 124 and 126 which are used to couple various voltage sources (e.g., bitlines 103 and 105) to the inputs of sense amplifier 130. A reference voltage generator 128 is also coupled to an input of multiplexer 126 and may serve as an alternate voltage source for an input of sense amplifier 130. As shown, multiplexer 124 is configured to apply a voltage from bitline 103 to a positive input of sense amplifier 130 when ROM cell 110 is being accessed and to apply a voltage from bitline 105 to the positive input of sense amplifier 130 when ROM cell 112 is being accessed. Reference voltage generator 128 generates a reference voltage used in determining the logic state of either ROM cell 110 or ROM cell 112. The reference voltage generator 128 is configured to generate a reference voltage which is substantially midway between a logic low voltage and a logic high voltage. When either ROM cell 110 or ROM cell 112 is being accessed, multiplexer 126 couples the reference voltage from reference voltage generator 128 to the negative input of sense amplifier 130.

If ROM cell 110 is programmed to be connected to bitline 103 then, during a read access from ROM cell 110, virtual ground driver 120 drives virtual ground line 121 low, virtual ground driver 122 holds virtual ground line 123 high and ROM wordline 106 is driven high by appropriate logic (not shown). Virtual ground drivers 120 and 122 may be activated to drive appropriate voltages onto virtual ground lines 121 and 123, respectively, in response to select signals provided by appropriate logic within memory 100 (not shown). Note that, in general, these select signals will be different than the select signals applied to column select pass gates 118. Bitline load 114 keeps bitline 103 high when ROM cell 110 is not being accessed. However, when ROM cell 110 is being accessed, ROM cell 110 pulls against bitline load transistor 114, lowering the voltage on bitline 103. During this read access, column select pass gates 118 will be turned on such that the voltage on bitline 103 will be applied to one input of multiplexer 124 and then to the positive input of sense amplifier 130. The reference voltage from the reference voltage generator 128 is applied to one of the inputs of multiplexer 126 and then to the negative input of sense amplifier 130. Because ROM cell 110 pulls the voltage on bitline 103 below the reference voltage, the voltage at the positive input of sense amplifier 130 is below the reference voltage at the negative input of sense amplifier 130. Consequently, the output of sense amplifier 130 is a logic zero.

Conversely, if ROM cell 110 is programmed so that it is not connected to bitline 103 then, during a read access from ROM cell 110, the output of sense amplifier 130 is driven to a logic high state. This is because when ROM cell 103 is programmed so that it is not connected to bitline 103 and column select pass gates 118 select bitline 103 for coupling to multiplexer 124, the positive input of sense amplifier 130 is high because of the action of bitline load transistor 114. The reference voltage from reference voltage generator 128 is applied to the negative input of sense amplifier 130 and is lower than the voltage from bitline 103 at the positive input of sense amplifier 130. Thus, the output of sense amplifier 130 is a logic high.

In memory 100, the voltage on bitline 105 is applied to the negative input of sense amplifier 130 and the voltage on bitline 103 is applied to the positive input of sense amplifier 130 when RAM cell 104 is being read. When RAM wordline 102 is driven high (e.g., by appropriate row decoding logic (not shown)), RAM cell 104 generates differential voltages on bitlines 103 and 105. If column select pass gates 118 are turned on, bitlines 103 and 105 are coupled, via multiplexers 124 and 126 respectively, to the positive and negative inputs of sense amplifier 130. If RAM cell 104 stores a logic one, then bitline 103 has a higher voltage than bitline 105 and the output of sense amplifier 130 is a logic one. If RAM cell 104 stores a logic zero, then bitline 103 has a lower voltage than bitline 105 and the output of sense amplifier 130 is a logic zero.

Figure 2:
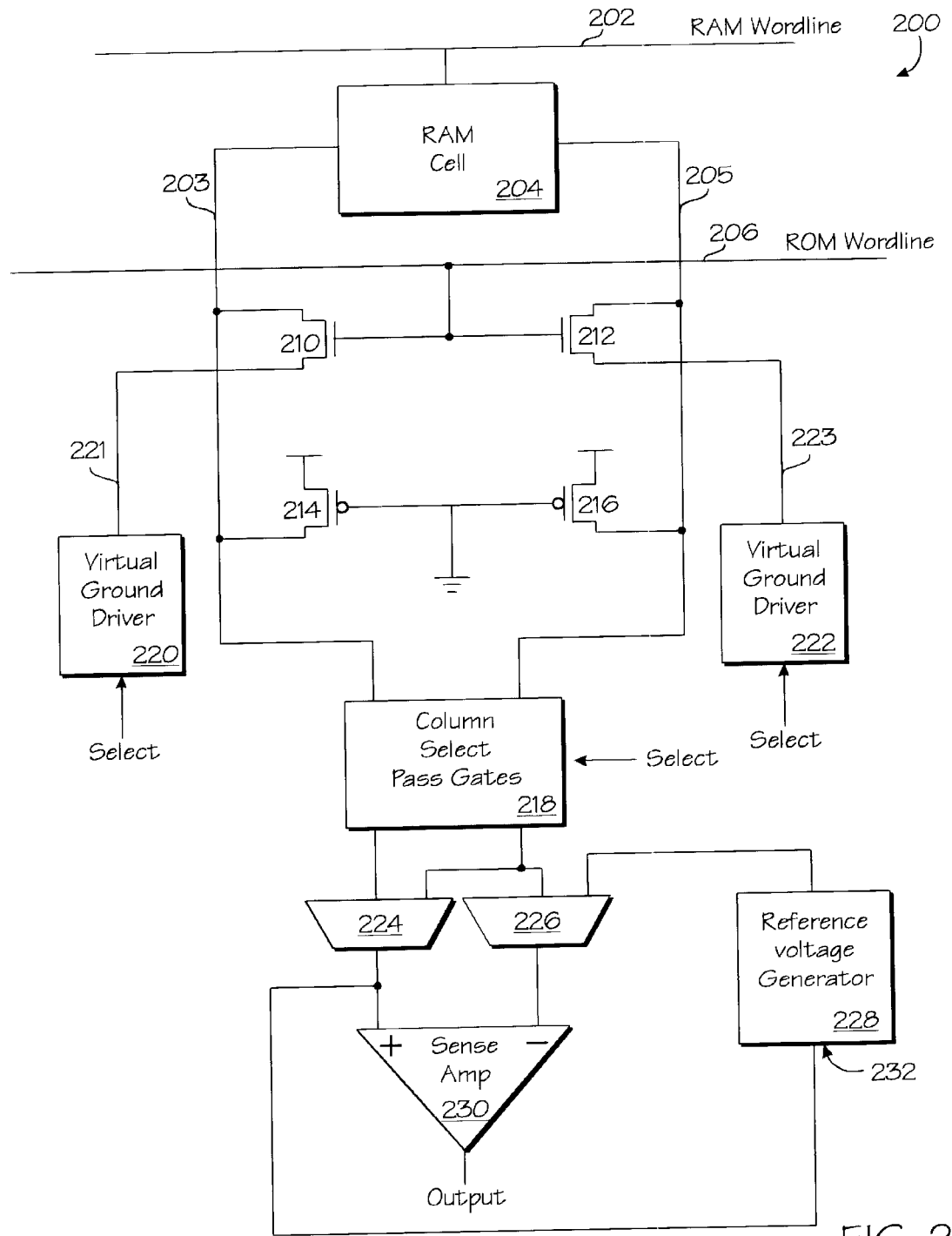
FIG. 2 illustrates another embodiment of a RAM/ROM architecture having shared bitlines and a shared sense amplifier with a modulated reference voltage generator input.

FIG. 2 illustrates a memory 200 which is configured in a manner similar to memory 100 of FIG. 1. In FIG. 2, elements labeled 2xx generally correspond to elements labeled 1xx in FIG. 1. For example, ROM cell 210 of FIG. 2 corresponds to ROM cell 110 of FIG. 1 and so on. Memory 200 is different from memory 100 in that there is a reference voltage generator 228 having an input 232 coupled to the output of multiplexer 224. This input allows reference voltage generator 228 to use the voltage at the output of multiplexer 224 to modulate the reference voltage applied to the second input of multiplexer 226. As the voltage at the output of multiplexer 224 goes high, reference voltage generator 228 pulls the voltage at the second input of multiplexer 226 lower. As the voltage at the output of multiplexer 224 goes low, reference voltage generator 228 drives the voltage at the second input of multiplexer 226 high. Thus, the signal margin (i.e., the voltage differential between the two voltages presented at the inputs of sense amplifier 230) into sense amplifier 230 is increased, improving the accuracy and noise immunity of the sensing of the logic states of ROM cell 210 or ROM cell 212.

Figure 3:
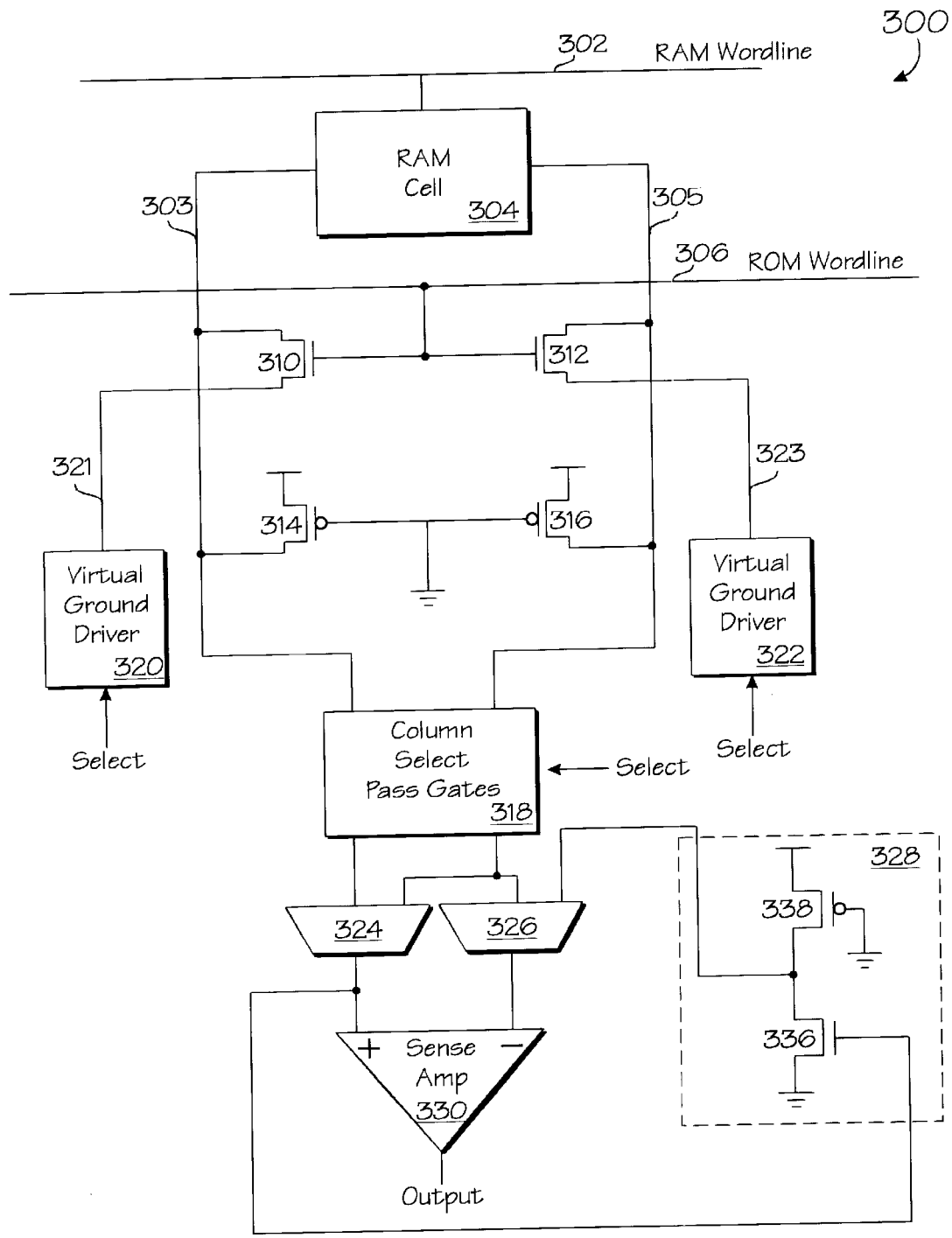
FIG. 3 illustrates yet another embodiment of a RAM/ROM architecture having a reference voltage generator configured according to a further embodiment of the present invention.

FIG. 3 illustrates memory 300. In FIG. 3, elements labeled 3xx generally correspond to elements labeled 2xx in FIG. 2. Shown in greater detail is reference voltage generator 328. Reference voltage generator 328 includes a transistor 336 coupled between ground and a second input of multiplexer 326. Transistor 336 is configured to be gated by a voltage at the output of multiplexer 324. Reference voltage generator 328 also includes a transistor 338 coupled between a supply voltage source and the second input of multiplexer 326. Transistor 338 is configured to be gated by ground. In this configuration, reference voltage generator 328 will generally be switched on because the gate of p-channel transistor 338 is tied to ground. It should be noted that other configurations may be used wherein the reference voltage generator 328 may be under the control of a logic signal which may be used to switch the reference voltage generator off when not in use. For example, transistor 338 may be gated by a logic control signal which could be switched high to turn off the reference voltage generator. In still other configurations, a control transistor (gated by an appropriate logic control signal) could be placed in series with transistor 338 to the supply voltage source and used as a switch to control the operation of reference voltage generator 328. Alternatively, a control transistor (gated by an appropriate logic control signal) could be placed in series with transistor 338 and ground and used to control the operation of reference voltage generator 328. Still other configurations for switching the reference voltage generator on and off at appropriate times could be used and would be apparent to those of ordinary skill in the art. Such configurations may be advantageous where memory 300 is to be configured to provide a low power mode of operation where little or no standby power is to be dissipated and it should be understood that such configurations are contemplated for use with any of the embodiments of the present invention described herein.

The higher the voltage at the output of multiplexer 324, the more transistor 336 is driven to pull the voltage at the second input of multiplexer 326 low. The lower the voltage at the output of multiplexer 324 the less transistor 336 is driven to pull against transistor 338, allowing transistor 338 to pull the voltage at the second input of multiplexer 326 higher. Thus, the output voltage from multiplexer 324 (which is received from one of the bitlines 303 or 305) is used to modulate the voltage produced by reference voltage generator 328 (i.e., the voltage at the second input of sense amplifier 330).

Figure 4:
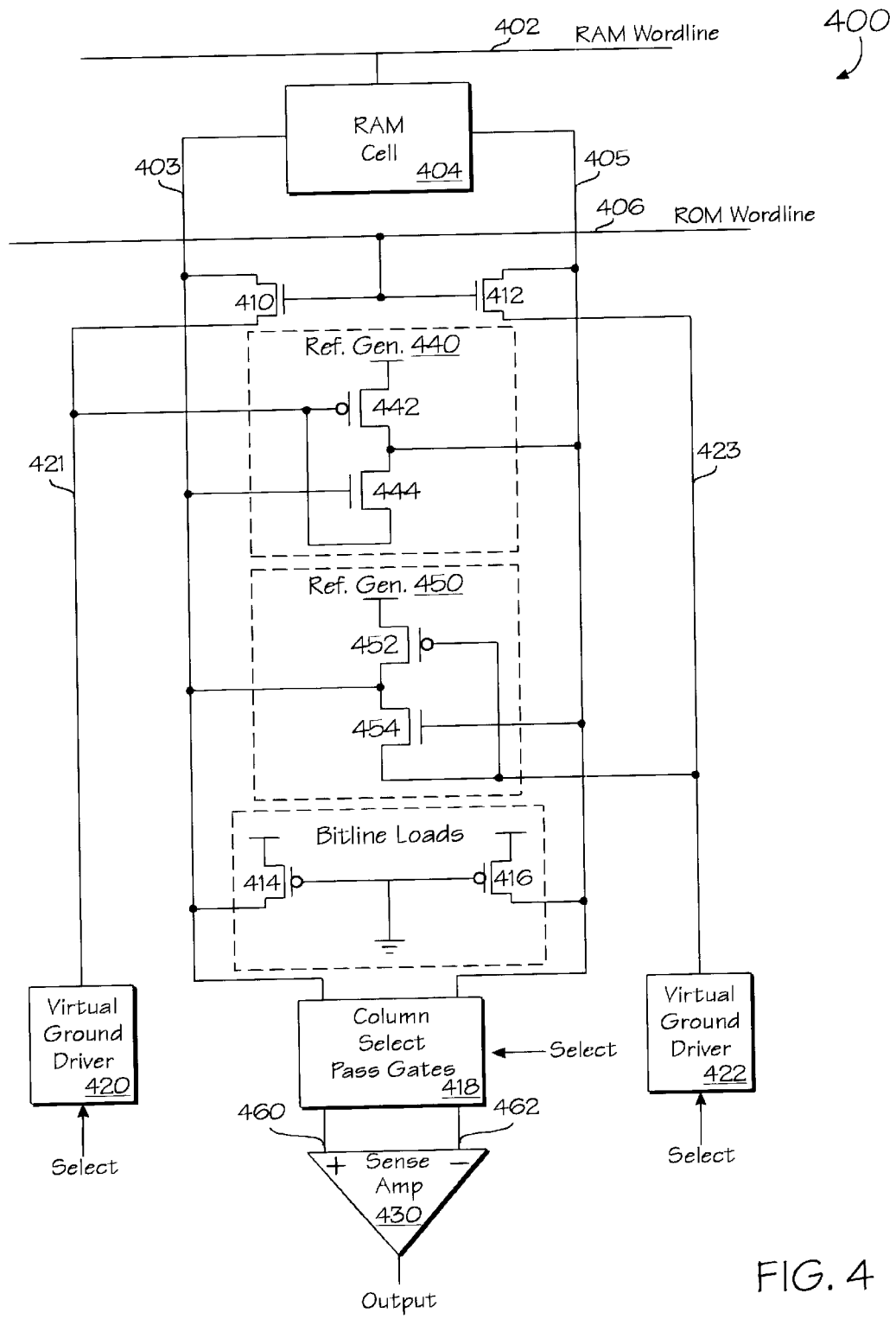
FIG. 4 illustrates an additional embodiment of a RAM/ROM architecture having reference voltage generators configured according to an additional embodiment of the present invention.

FIG. 4 illustrates a memory 400 which generally includes a RAM cell 404 coupled between bitlines 403 and 405. RAM cell 404 has an input configured to receive a voltage signal on a RAM wordline 402 that may select a whole row of RAM cells in memory 400. Memory 400 also includes a ROM cell 410 coupled between bitline 403 and a virtual ground driver 420. A further ROM cell 412 is coupled between bitline 405 and another virtual ground driver 422. ROM cells 410 and 412 may be selected using ROM wordline 406 (which may generally be used to select an entire row of ROM cells).

The logic states of ROM cells 410 and 412 are determined by sensing the voltages on bitlines 403 and 405, respectively. Coupled to bitline 403 is a bitline load transistor 414 for keeping bitline 403 at substantially a supply voltage. Likewise, coupled to bitline 405 is a bitline load transistor 416 for keeping bitline 405 at substantially the supply voltage.

Column select pass gates 418 have a first input coupled to bitline 403 and a second input coupled to bitline 405. Column select pass gates 418 may be used to couple bitlines 403 and 405 to sense amplifier 430 in response to (a) select signal(s) (e.g., from column decoding logic (not shown)). The outputs of column select pass gates 418 are provided to transmission bus lines (TBUS) 460 and 462. In effect, TBUS 460 couples the voltage on bitline 403 to the positive input of sense amplifier 430 and TBUS 462 couples the voltage on bitline 405 to the negative input of sense amplifier 430. Thus, bitlines 403 and 405 are coupled to sense amplifier 430 so that the logic state of either ROM cell 410, ROM cell 412 or RAM cell 404 can be determined.

As shown in FIG. 4, a reference voltage generator 440 is coupled between bitline 403 and bitline 405 and is configured to modulate the voltage on bitline 405 during read accesses of ROM cell 410. Further, another reference voltage generator 450 is coupled between bitline 403 and bitline 405 and is configured to modulate the voltage on bitline 403 during read accesses of ROM cell 412. Reference voltage generator 440 has a transistor 442 coupled between a source voltage and bitline 405. Transistor 442 is gated by a voltage on line 421 from virtual ground driver 420. Reference voltage generator 440 also has a transistor 444 coupled between bitline 405 and line 421. Transistor 444 is gated by the voltage on bitline 403. Similarly, reference voltage generator 450 has a transistor 452 coupled between a source voltage and bitline 403. Transistor 452 is gated by a voltage on line 423 from virtual ground driver 422. Reference voltage generator 450 also has a transistor 454 coupled between bitline 403 and line 423. Transistor 454 is gated by a voltage on bitline 405.

During a read access from ROM cell 410, virtual ground driver 420 and ROM wordline 406 are activated. That is, ROM wordline 406 is raised to a logic high potential while virtual ground driver 420 outputs a logic low voltage on line 421, causing ROM cell 410 to turn on and (assuming ROM cell 410 is programmed to be connected to bitline 403) pull against bitline load transistor 414. Bitline load 414 typically keeps bitline 403 high when ROM cell 410 is not being accessed. However, when ROM cell 410 is being accessed, ROM cell 410 pulls against bitline load transistor 414, lowering the voltage on bitline 403. Because the output of virtual ground driver 422 is high during this access, ROM cell 412 and transistors 452 and 454 in reference voltage generator 450 are off.

In reference voltage generator 440, when the signal on line 421 from virtual ground driver 420 is low, transistors 442 and 444 are on. For the case where ROM cell 410 is programmed to be connected to bitline 403, the voltage on bitline 405 is slightly above a logic mid-level voltage. Bitline load transistor 416 and transistor 442 pull bitline 405 substantially high while transistor 444 pulls bitline 405 low. Bitline 405 is above the mid-level voltage because the gate-to-source voltage, VGS, of transistor 444 is reduced below the supply voltage because ROM cell 410 pulls against bitline load transistor 414, lowering the voltage on bitline 403. Transistor 444 may be approximately the same size as ROM cell 410. Transistor 442 may be approximately the same size as bitline load transistor 416. So, on bitline 403, ROM cell 410 and bitline load transistor 414 pull against each other. Whereas on bitline 405, the reference side, transistor 444 pulls against both transistor 442 and bitline load transistor 416. Consequently, transistor 444 cannot pull the voltage down on the reference side as far as ROM cell 410, pulling against bitline load transistor 414, pulls the voltage down on bitline 403. Because the VGS of transistor 444 is modulated by the voltage on bitline 403, reference voltage generator 440 modulates the voltage on bitline 405 using the voltage on bitline 403.

During the read access, column select pass gates 418 may be turned on such that the voltage on bitline 403 is applied to the positive input of sense amplifier 430 and the voltage on bitline 405 is applied to the negative input of sense amplifier 430. Because the voltage on bitline 403 is lower than the voltage on bitline 405, the voltage at the positive input of sense amplifier 430 is lower than the voltage at its negative input. Consequently, sense amplifier 430 will output a logic zero.

For a read access from ROM cell 410 when ROM cell 410 is programmed so it is not connected to bitline 403, bitline 403 will remain logic high (due to the action of bitline load transistor 414) when ROM cell 410 is accessed. Note that during this access, the output of virtual ground driver 420 will be low while the output of virtual ground driver 422 will be high. Consequently, reference voltage generator 450 remains off, however, reference voltage generator 440 switches on, pulling the voltage on bitline 405 to a mid-level logic level. Thus, the voltage on bitline 403 (and, consequently, at the positive input of sense amplifier 430) is higher than the voltage on bitline 405 (and at the negative input of sense amplifier 430), so the output of sense amplifier 430 will be a logic one.

Notice that for both of these read accesses, the reference voltage generator 440 was used to modulate the voltage on bitline 405 in response to the voltage on bitline 403.

The state of ROM cell 412 may be sensed in a manner similar to that described above. During a read access of ROM cell 412, virtual ground driver 422 and ROM wordline 406 are activated. That is, ROM wordline 406 is raised to a logic high potential while virtual ground driver 422 outputs a logic low voltage on line 423, causing ROM cell 412 to turn on and (assuming ROM cell 412 is programmed to be connected to bitline 405) pull against bitline load transistor 416. Bitline load 416 typically keeps bitline 405 high when ROM cell 412 is not being accessed. However, when ROM cell 412 is being accessed, ROM cell 412 pulls against bitline load transistor 416 lowering the voltage on bitline 405. Because the output of virtual ground driver 420 stays high, ROM cell 410 and transistors 442 and 444 in reference voltage generator 440 are off.

In reference voltage generator 450, when the signal on line 423 from virtual ground driver 422 is low, transistors 452 and 454 are on. For the case where ROM cell 412 is programmed to be connected to bitline 405, the voltage on bitline 403 is slightly above a logic mid-level voltage. Bitline load transistor 414 and transistor 452 pull bitline 403 substantially high while transistor 454 pulls bitline 403 low. Bitline 403 is above the mid-level voltage because the VGS of transistor 454 is reduced below the supply voltage because ROM cell 412 pulls against bitline load transistor 416 lowering the voltage on bitline 405. Transistor 454 may be approximately the same size as ROM cell 412. Transistor 452 may be approximately the same size as bitline load transistor 414. So, on bitline 405, ROM cell 412 and bitline load transistor 416 pull against each other. Whereas on bitline 403, the reference side, transistor 454 pulls against both transistor 452 and bitline load transistor 414. Consequently, transistor 454 cannot pull the voltage down on the reference side as far as ROM cell 412, pulling against bitline load transistor 416, pulls the voltage down on bitline 405. Because the VGS of transistor 454 is modulated by the voltage on bitline 405, reference voltage generator 450 modulates the voltage on bitline 403 using the voltage on bitline 405.

During the read access, column select pass gates 418 may be turned on such that the voltage on bitline 403 is applied to the positive input of a sense amplifier 430 and the voltage on bitline 405 is applied to the negative input of sense amplifier 430. Because the voltage on bitline 403 is higher than the voltage on bitline 405, the voltage at the positive input of sense amplifier 430 is higher than the voltage at its negative input. Consequently, the output of sense amplifier 430 is a logic one.

For a read access from ROM cell 412 when ROM cell 412 is programmed so it is not connected to bitline 405, bitline 405 will remain logic high (due to the action of bitline load transistor 416) when ROM cell 412 is accessed. Note that during this access, the output of virtual ground driver 422 will be low while the output of virtual ground driver 420 will be high. Consequently, reference voltage generator 440 remains off, however reference voltage generator 450 is switched on, pulling the voltage on bitline 403 to a mid-level logic level. Thus, the voltage on bitline 405 (and, consequently, at the negative input of sense amplifier 430) is higher than the voltage on bitline 403, so the output of sense amplifier 430 is a logic zero.

Notice that for both of the read accesses from ROM cell 412, the reference voltage generator 450 was used to modulate the voltage on bitline 403 in response to the voltage on bitline 405.

Figure 5:
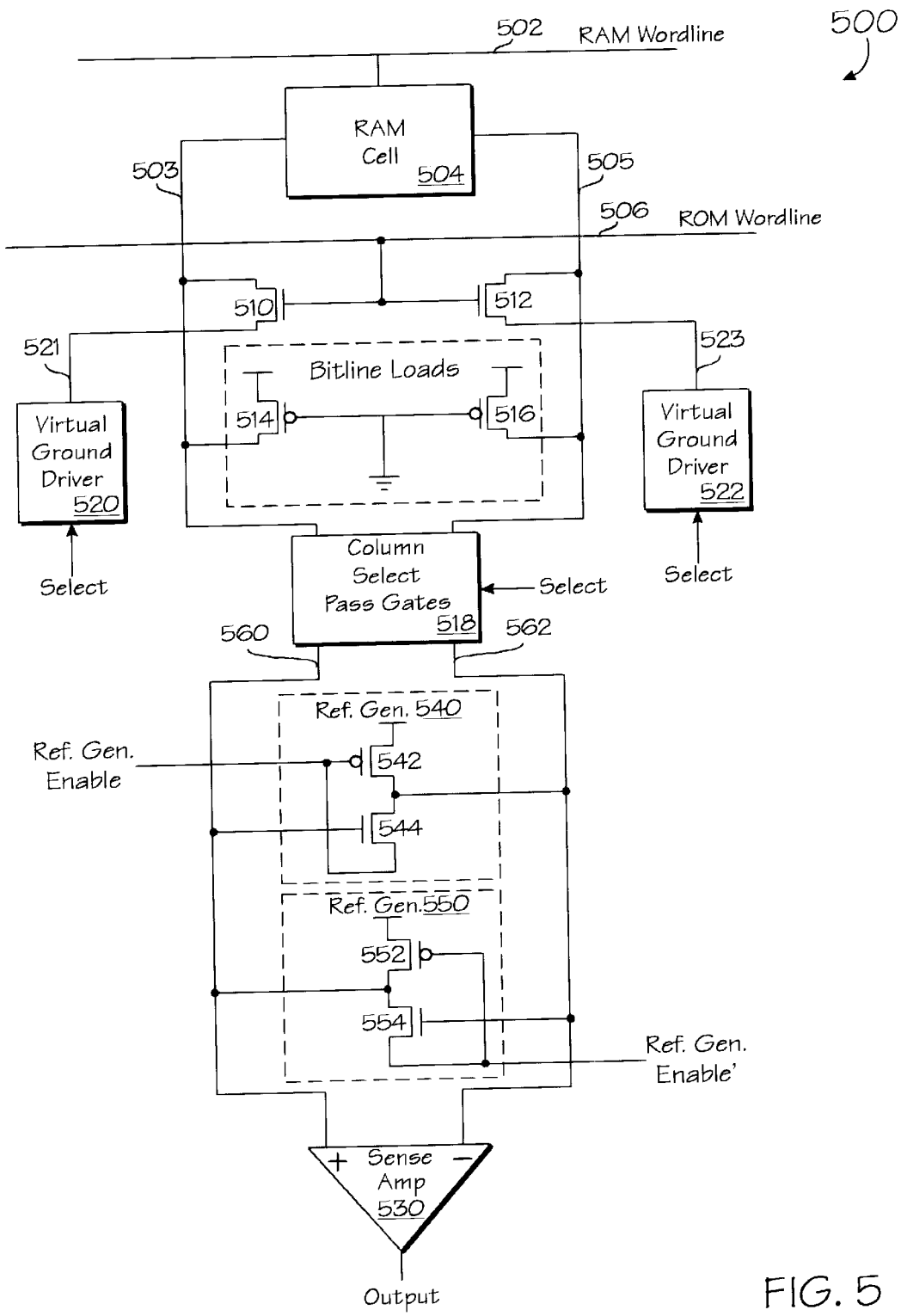
FIG. 5 illustrates yet another embodiment of a RAM/ROM architecture having reference voltage generators configured according to a further embodiment of the present invention.

FIG. 5 illustrates a memory 500 configured in accordance with yet another embodiment of the present invention. Memory 500 generally includes a RAM cell 504 coupled between bitlines 503 and 505. RAM cell 504 has an input configured to receive a voltage signal on a RAM wordline 502 that may select a whole row of RAM cells in memory 500. Memory 500 also includes a ROM cell 510, coupled between bitline 503 and the output of a virtual ground driver 520, and a ROM cell 512, coupled between bitline 505 and the output of virtual ground driver 522. The programmed logic states of ROM cell 510 and ROM cell 512 (which may be accessed using ROM wordline 506) are determined by sensing the voltages on bitline 503 and bitline 505, respectively.

Also coupled to bitline 503 is a bitline load transistor 514 for keeping bitline 503 at substantially a source voltage. Likewise, coupled to bitline 505 is a bitline load transistor 516 for keeping bitline 505 at substantially the source voltage.

Column select pass gates 518 are used to couple bitlines 503 and 505 to sense amplifier 530 in response to (a) select signal(s). The outputs of column select pass gates 518 are coupled to transmission bus lines, TBUS, 560 and 562. TBUS 560 couples bitline 503 to the positive input of sense amplifier 530 and TBUS 562 couples bitline 505 to the negative input of sense amplifier 530. Thus, the voltages on bitlines 503 and 505 are coupled to the inputs of sense amplifier 530 for sensing the logic states of ROM cells 510 and 512 and RAM cell 504.

Reference voltage generators 540 and 550 are coupled between TBUSs 560 and 562. Reference voltage generators 540 and 550 are configured to modulate the voltages on TBUSs 560 and 562 to thereby improve the signal margins for the inputs to sense amplifier 530.

Reference voltage generator 540 includes transistors 542 and 544 coupled in a common drain configuration with a shared output coupled to TBUS 562. Transistor 542 is coupled between a source voltage and TBUS 562 and is gated by an input signal (Ref. Gen. Enable) which may be a logical AND of corresponding virtual ground driver outputs (i.e., the input signal may be a logical zero if any ROM column is "on" for the column group containing ROM cell 510). Transistor 544 is coupled between TBUS and the input signal used to gate transistor 542 and is itself gated by the signal on TBUS 560. Likewise, reference voltage generator 550 includes transistors 552 and 554 which are coupled together between a source voltage and an input signal (Ref. Gen. Enable') which may be a logical AND of corresponding virtual ground driver outputs (i.e., the input signal will be a logical zero if any ROM column is "on" for the column group containing ROM cell 512) in a common drain configuration with an output coupled to TBUS 560. Transistor 552 is gated by the logical AND input signal (Ref. Gen. Enable') and transistor 554 is gated by the signal on TBUS 562.

During a read access of ROM cell 510, virtual ground driver 520 and ROM wordline 506 are activated so that the voltage on ROM wordline 506 is driven high and the output of virtual ground driver 520 is logic low. The output of virtual ground driver 522 is high during this access. Bitline load transistor 514 typically keeps the voltage on bitline 503 high when ROM cell 510 is not being accessed. However, when ROM cell 510 is being read, and assuming ROM cell 510 is programmed to be connected to bitline 503, ROM cell 510 pulls against bitline load transistor 514, lowering the voltage on bitline 503. At the same time, the output of virtual ground driver 522 is high, thus ROM cell 512 is off. Bitline 505 is at a logic high potential because the bitline load transistor 516 pulls the bitline 505 substantially to the source voltage. Column select pass gates 518 are turned on such that the voltage on bitline 503 is applied to TBUS 560 and the voltage on bitline 505 is applied to TBUS 562.

Because ROM cell 510 is being accessed, the input enable signal (Ref. Gen. Enable) to reference voltage generator 540 will be a logic zero, thus, reference generator 540 will be on. Reference voltage generator 550 will be off because its input enable signal (Ref. Gen. Enable') will remain high. As a result of these input signals, transistors 542 and 544 are on, but transistor 544 is not on very strongly because ROM cell 510 pulls against bitline load transistor 514, lowering the voltage on bitline 503, and, consequently, on TBUS 560. As a result, transistor 544, which is gated by the signal on TBUS 560, does not pull as strongly against transistor 542 and bitline load transistor 516. Thus, reference voltage generator 540 outputs a logic mid-level voltage, thereby modulating the voltage on TBUS 562 using the voltage on TBUS 560. Accordingly, the voltage at the positive input of sense amplifier 530 will be lower than the voltage at its negative input and sense amplifier 530 will have an output representing a logic zero. ROM cell 512 is accessed in substantially the same manner as ROM cell 510. Furthermore, RAM cell 504 is accessed in a conventional fashion.

Figure 6:
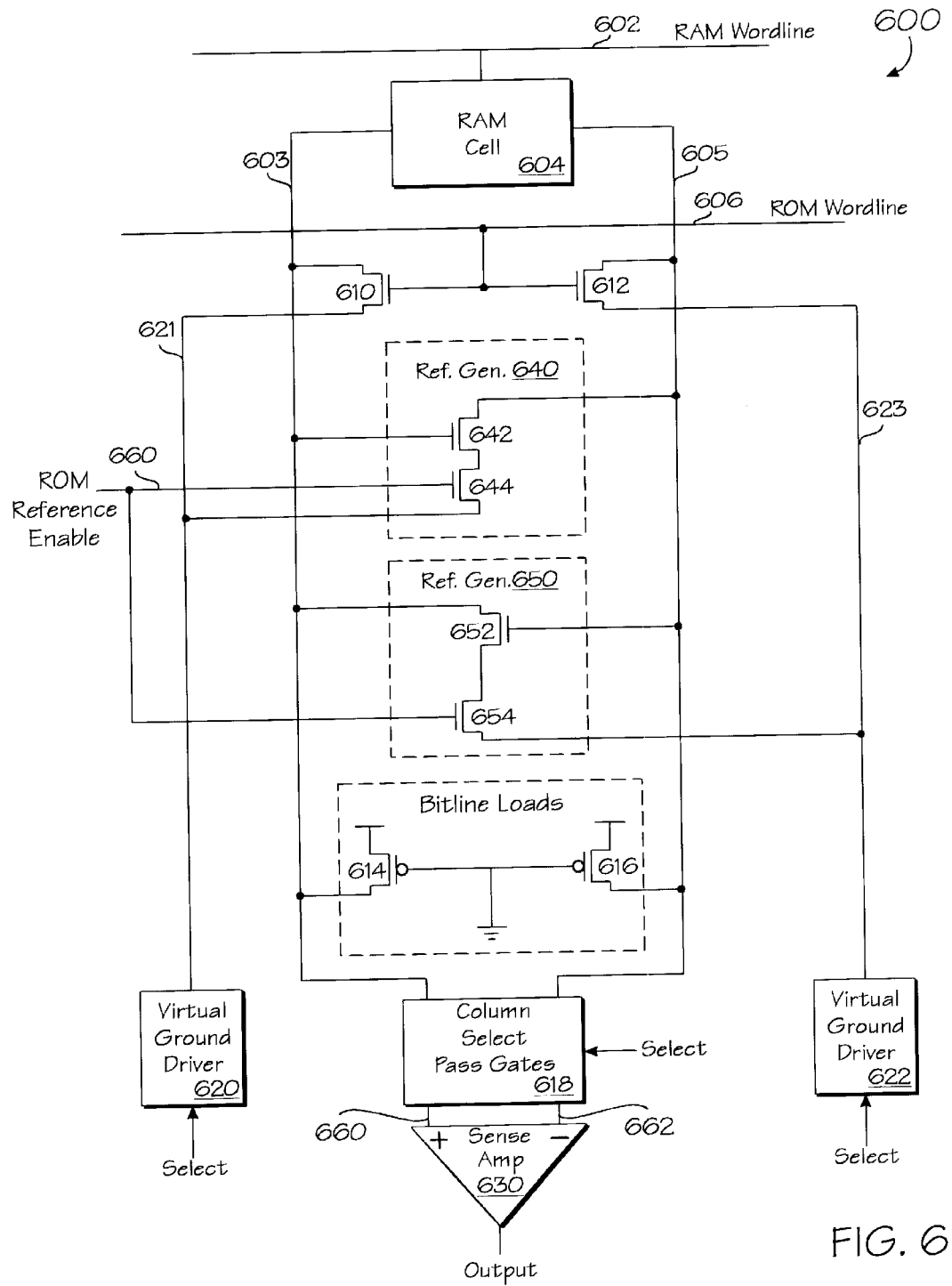
FIG. 6 illustrates an additional embodiment of a RAM/ROM architecture having reference voltage generators configured according to yet another embodiment of the present invention.

FIG. 6 illustrates yet another embodiment of the present invention. A memory 600 includes a RAM cell 604 coupled between bitlines 603 and 605 and accessible through RAM wordline 602. Memory 600 also includes ROM cell 610 coupled between the output of virtual ground driver 620 and bitline 603, and ROM cell 612 coupled between the output of virtual ground driver 622 and bitline 605. ROM cells 610 and 612 are accessed through ROM wordline 606.

Voltages on bitline 603 and 605 are coupled to the positive and negative inputs, respectively, of sense amplifier 630 through column select pass gates 618. Column select pass gates 618 are activated in response to (a) select signal(s) (e.g., from corresponding column decoding logic). The voltages provided to sense amplifier 630 are modulated by reference voltage generators 640 and 650 as discussed below.

Reference voltage generator 640 is coupled between bitlines 605 and virtual ground line 621 and includes transistors 642 and 644. Transistor 642 is coupled between bitline 605 and a common connection with transistor 644 and is gated by the signal on bitline 603. Transistor 644 is coupled between the common connection with transistor 642 and the output line 621 from virtual ground driver 620 and is gated by a ROM reference enable signal 660. The ROM reference enable signal is provided by appropriate logic (not shown) within memory 600 such that reference voltage generator 640 will be activated substantially at the same time that ROM cell 510 is accessed for a read.

Likewise, reference voltage generator 650 is coupled between bitlines 603 and virtual ground line 623 and includes transistors 652 and 654. Transistor 652 is coupled between bitline 603 and a common connection with transistor 654 and is gated by the signal on bitline 605. Transistor 654 is coupled between the common connection with transistor 654 and the output line 623 from virtual ground driver 622 and is gated by the ROM reference enable signal 600 (which, together with a logic low signal on virtual ground line 623, will activate reference voltage generator 650 during a read access of ROM cell 612.

During operation, RAM cell 604 may be read from and written to using bitlines 603 and 605 and RAM wordline 602 in the conventional fashion. For a read access of ROM cell 610, ROM wordline 606 is driven high (e.g., by corresponding row decoder logic) and virtual ground driver 620 is activated, thus outputting a logic low on line 621. During this process, ROM enable reference signal 660 is activated, turning on transistor 644 of reference voltage generator 640.

In response to ROM wordline 606 being activated, if ROM cell 610 is programmed to be connected to bitline 603, the voltage on bitline 603 will be pulled down. At the same time, reference voltage generator 640 will be activated and transistors 642 and 644 will be on (due to a combination of a logic low signal on virtual ground line 621 and a logic high ROM reference enable signal 660). This causes the voltage on bitline 605 to be modulated from its mid-level to a slightly higher potential.

The voltage on bitline 603 is coupled through column select pass gates 618 to the positive input of sense amplifier 630 while the voltage on bitline 605 is coupled to the negative input of sense amplifier 630. Because the voltage on bitline 603 is lower than that on bitline 605, sense amplifier 630 outputs a logic zero. Had ROM cell 610 been programmed such that it was not connected to bitline 603, the voltage on bitline 603 would be higher than that on bitline 605 and the output of sense amplifier 630 would be a logic one. ROM cell 612 may be read in a similar manner.

Thus, a novel reference voltage generator for an integrated ROM/RAM architecture has been disclosed. Although discussed with reference to specific embodiments and the accompanying illustrations, it should be appreciated that the present invention is applicable to a variety of single-ended sense applications, ROM dual bitline architectures and ROM/RAM shared bitline architectures. Accordingly, the invention should only be measured in terms of the claims which follow.

What is claimed is:

1. A reference voltage generator, comprising
   a first transistor coupled between a first voltage source and a first bitline and configured to be gated by a second voltage source; and
   a second transistor coupled between the first bitline and the second voltage source and configured to be gated by a third voltage source.

2. The reference voltage generator of claim 1, wherein the first transistor is a PMOS transistor.

3. The reference voltage generator of claim 2, wherein the second transistor is a NMOS transistor.

4. The reference voltage generator of claim 3, wherein the second voltage source is provided by a virtual ground driver.

5. The reference voltage generator of claim 4, wherein the third voltage source is provided on a second bitline.

6. The reference voltage generator of claim 5, wherein the second transistor is further coupled to a first bitline load transistor.

7. The reference voltage generator of claim 6, wherein the second transistor is further coupled to a ROM cell coupled to the second bitline and the virtual ground driver.

8. The reference voltage generator of claim 7, wherein the ROM cell is further coupled to a RAM cell through the second bitline.

9. The reference voltage generator of claim 8, wherein the RAM cell is further coupled to a second ROM cell through the first bitline.

10. A memory comprising the reference voltage generator of claim 1 and a second reference voltage generator complementary thereto.

11. A memory as in claim 10 further comprising a RAM cell and a ROM cell coupled to the first bitline.

12. A memory device, comprising:
- a random access memory (RAM) cell coupled between a pair of bitlines, the bitlines providing input paths to a sense amplifier within the memory device;
- a pair of read only memory (ROM) cells, each of the ROM cells being coupled to a respective one of the bitlines; and
- a reference voltage generator having inputs and outputs, wherein a first of the inputs is coupled to receive a first sense amplifier input voltage; and a first of the outputs is coupled to provide a second sense amplifier input voltage differing from the first sense amplifier input voltage.

13. The memory device of claim 12, wherein the first of the inputs of the reference voltage generator is coupled to receive the first sense amplifier input voltage from a first one of the bitlines; and the first of the outputs of the reference voltage generator is coupled to provide the second sense amplifier input voltage to a second one of the bitlines.

14. The memory device of claim 12, wherein the second sense amplifier input voltage increases as the first sense amplifier input voltage decreases.

15. The memory device of claim 12, wherein the first of the inputs of the reference voltage generator is coupled to one of the ROM cells.

16. The memory device of claim 15, wherein the first of the inputs of the reference voltage generator is coupled to a first bitline load circuit of the memory device.

17. The memory device of claim 12 further comprising a first wordline coupled to each of the ROM cells.

18. The memory device of claim 17 further comprising a second wordline coupled to the RAM cell.

* * * * *